(12) United States Patent
Joo et al.

(10) Patent No.: US 7,037,762 B2
(45) Date of Patent: May 2, 2006

(54) PHASE CHANGEABLE MEMORY DEVICES HAVING MULTI-LEVEL DATA STORAGE ELEMENTS AND METHODS OF FABRICATING THE SAME

(75) Inventors: Jae-Hyun Joo, Seoul (KR); Hideki Horii, Gyeonggi-do (KR)

(73) Assignee: Samsung Electronics Co., Ltd., (KR)

( * ) Notice: Subject to any disclaimer, the term of this patent is extended or adjusted under 35 U.S.C. 154(b) by 252 days.

(21) Appl. No.: 10/430,980

(22) Filed: May 7, 2003

(65) Prior Publication Data

US 2003/0222292 A1     Dec. 4, 2003

(30) Foreign Application Priority Data

May 10, 2002    (KR)    ..................... 10-2002-0025778

(51) Int. Cl.
*H01L 21/82*     (2006.01)

(52) U.S. Cl. ...................................... 438/128; 257/209

(58) Field of Classification Search ................. 257/74, 257/208, 209, 211, 528–530, 390, 758; 438/95, 438/128, 131–132, 141, 380, 600; 365/51, 365/96

See application file for complete search history.

(56) References Cited

U.S. PATENT DOCUMENTS 4,545,111 A * 10/1985 Johnson ......................... 438/6
5,835,396 A * 11/1998 Zhang .......................... 365/51
6,235,603 B1 * 5/2001 Melnick et al. .............. 438/393

FOREIGN PATENT DOCUMENTS

| JP | 10-256508   | 9/1998  |
|----|-------------|---------|
| JP | 2001-127263 | 11/2001 |
| KR | 10-236691   | 1/2000  |

\* cited by examiner

*Primary Examiner*—David Vu
(74) *Attorney, Agent, or Firm*—Myers Bigel Sibley & Sajovec

(57) ABSTRACT

A phase changeable memory device includes a lower interlayer dielectric layer on a semiconductor substrate. A plurality of first phase changeable data storage elements is disposed on the lower interlayer dielectric layer. A middle interlayer dielectric layer covers the first phase changeable data storage elements and the lower interlayer dielectric layer. A plurality of second phase changeable data storage elements is disposed on the middle interlayer dielectric layer. The first and second phase changeable data storage elements are arrayed in rows and columns such that respective first phase changeable data storage elements are disposed between respective adjacent second phase changeable data storage elements in the rows and columns. A plate electrode overlies the first and second phase changeable data storage elements and is electrically connected to the first and second phase changeable data storage elements. Related fabrication methods are also disclosed.

33 Claims, 21 Drawing Sheets

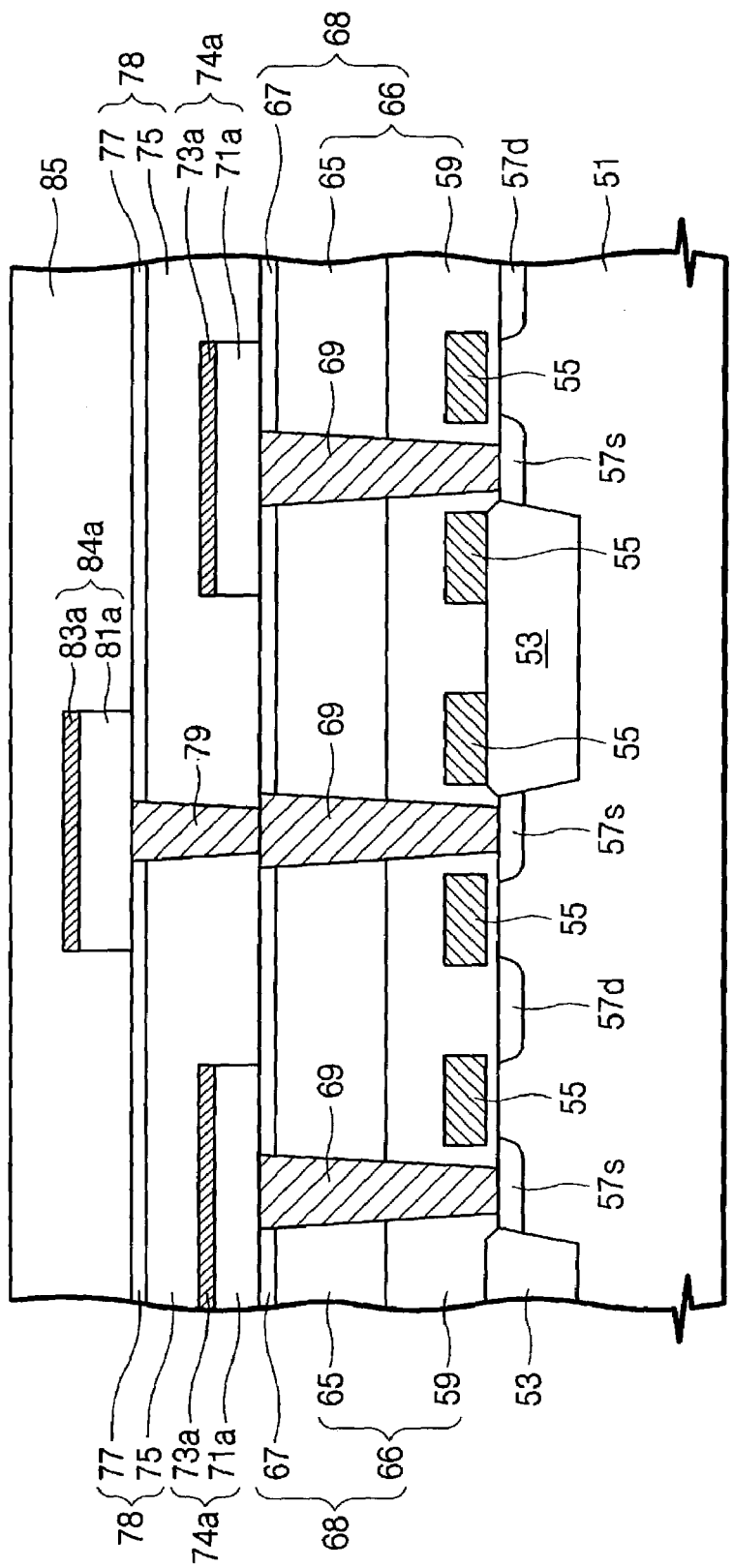

PHASE CHANGEABLE MEMORY DEVICES HAVING MULTI-LEVEL DATA STORAGE ELEMENTS AND METHODS OF FABRICATING THE SAME

RELATED APPLICATION

This application claims priority from Korean Patent Application No. 2002-25778 filed on May 10, 2002 in the Korean Intellectual Property Office, the disclosure of which is incorporated herein in its entirety by reference.

BACKGROUND OF THE INVENTION

The present invention relates to nonvolatile memory devices and methods of fabricating the same and, more specifically, to phase changeable memory devices and fabrication methods therefor.

Semiconductor memory devices can be classified into volatile memory devices and nonvolatile memory devices. Volatile memory devices typically lose their stored data when their power supplies are interrupted. Nonvolatile (or "less volatile") memory devices can typically retain their stored data for extended periods of time when their power supplies are interrupted. Accordingly, nonvolatile memory devices are widely used in such devices as memory cards and mobile communications devices.

Nonvolatile memory devices often employ flash memory cells having stacked gate structures. Each of the stacked gate structures typically includes a tunnel oxide layer, a floating gate, an inter-gate dielectric layer and a control gate electrode stacked on a channel region. In order to enhance reliability and program efficiency of such a flash memory cell, it is generally desirable to improve the film quality of the tunnel oxide layer and the coupling ratio of the cell.

A relatively new type of nonvolatile memory device, the phase changeable memory device, has been proposed for use in place of more conventional flash memory. As shown in FIG. 1, a conventional phase changeable memory cell includes a single access transistor $T_A$ and a single variable resistor C, which are serially connected to one another. The variable resistor C includes a bottom electrode, a top electrode and a phase changeable material layer interposed therebetween. The top electrode of the variable resistor C is connected to a plate electrode PL. The access transistor $T_A$ includes a source region connected to the bottom electrode, a drain region spaced apart from the source region and a gate electrode located on a channel region between the source and drain regions. The gate electrode and the drain region are electrically connected to a word line WL and a bit line BL, respectively.

An equivalent circuit of the phase changeable memory cell is similar to that of a typical dynamic random access memory (DRAM) cell. However, the phase changeable material layer is quite different from the dielectric layer typically employed in a DRAM cell capacitor. In particular, the phase changeable material layer exhibits two stable states according to temperature.

FIG. 2 is a graph for illustrating typical operations for writing data to a phase changeable memory cell. In the graph, the abscissa indicates time T and the ordinate indicates temperature TMP applied to the phase changeable material layer.

Referring to FIG. 2, in the event that the phase changeable material layer is heated to a temperature that is higher than a melting point temperature Tm thereof for a first duration T1 and then is cooled down rapidly, the phase changeable material layer is transformed into an amorphous state (curve 1). However, if the phase changeable material layer is instead heated to a temperature that is in a range between a crystallization temperature Tc thereof and the melting point temperature Tm for a second duration T2 longer than the first duration T1 and then is cooled down, the phase changeable material layer is transformed into a crystalline state (curve 2).

Generally, the resistivity of the phase changeable material layer in the amorphous state is higher than the resistivity of the phase changeable material layer in the crystalline state. Therefore, it is possible to discriminate whether the information stored in the memory cell is a logic "1" or a logic "0" by detecting the current that flows through the phase changeable material layer in a read operation. A compound material layer containing germanium (Ge), stibium (Sb) and tellurium (Te) (hereinafter referred to a GST layer) is widely used as a phase changeable material layer.

FIG. 3 is a cross-sectional view showing conventional phase changeable memory cells and operations for forming them. An isolation layer 13 defining an active region is disposed in a semiconductor substrate 11. A pair of parallel word lines 15 is disposed on and cross the active region. Impurity regions are formed at both sides of the pair of word lines 15, in particular, a common drain region 17d between the pair of word lines 15, and source regions 17s formed at respective ends of the active region. The substrate having the source/drain regions 17s and 17d, the word lines 15 and the isolation layer 13 is covered with a first interlayer insulation layer 19. A bit line 21 is disposed on the first interlayer insulation layer 19. The bit line 21 is electrically connected to the common drain region 17d. Only a portion of the bit line 21 is shown in the figure, but the bit line 21 crosses over the word lines 15.

The substrate including the bit line 21 is covered with a second interlayer insulation layer 23. Contact plugs 25 are disposed in the second interlayer insulation layer 23. Respective ones of the contact plugs 25 are electrically connected to the source regions 17s. A pair of phase changeable material layer patterns 27 is disposed on the second interlayer insulation layer 23. The phase changeable material layer patterns 27 cover respective ones of the contact plugs 25. Top electrodes 29 are disposed on the phase changeable material layer patterns 27. Gaps between the phase changeable material layer patterns 27 are filled with a planarized interlayer insulation layer 31. The planarized interlayer insulation layer 31 and the top electrodes 29 are covered with a plate electrode 33.

When a writing voltage is applied to the contact plug 25 of a selected cell A in order to write data to the selected cell A, heat is typically generated at the interface between the phase changeable material layer pattern 27 and the contact plug 25 of the selected cell A. Consequently, a portion 27a of the selected phase changeable material layer pattern 27 is transformed into an amorphous state. At this moment, heat generated in the selected cell A can be conducted to the phase changeable material layer pattern 27 of a non-selected cell B adjacent the selected cell A, through the conductive plate electrode 33 and/or the planarized interlayer insulation layer 31. Consequently, a portion 27b of the non-selected cell B may also be transformed into an amorphous state. As a result, the non-selected cell B can be weakly written due to this thermal transfer. The thermal interference phenomenon can increase as the space between the pair of cells A and B becomes narrower.

As mentioned above, the conventional phase changeable memory cells are formed at the same level. Thus, when a phase changeable memory cell is selectively written, a non-selected cell adjacent to the selected cell may be undesirably written.

SUMMARY OF THE INVENTION

According to some embodiments of the present invention, a memory device comprises a lower interlayer dielectric layer on a semiconductor substrate. A plurality of first phase changeable data storage elements is disposed on the lower interlayer dielectric layer. A middle interlayer dielectric layer covers the first phase changeable data storage elements and the lower interlayer dielectric layer. A plurality of second phase changeable data storage elements is disposed on the middle interlayer dielectric layer. The first and second phase changeable data storage elements are arrayed in rows and columns such that respective first phase changeable data storage elements are disposed between respective adjacent second phase changeable data storage elements in the rows and columns. A plate electrode overlies the first and second phase changeable data storage elements and is electrically connected to the first and second phase changeable data storage elements.

According to some embodiments, the memory device may further include a plurality of first contact plugs passing through the lower interlayer dielectric layer, and a plurality of second contact plugs passing through the middle interlayer dielectric layer and contacting the second phase changeable data storage element. The first contact plugs include a first group of first contact plugs that are in contact with the first phase changeable data storage elements and a second group of first contact plugs that are in contact with the second contact plugs.

In further embodiments of the present invention, the memory device includes a plurality of first contact plugs passing through the lower interlayer dielectric layer and contacting the first phase changeable data storage elements, and a plurality of second contact plugs passing through the middle interlayer dielectric layer and contacting the second phase changeable data storage elements. The second contact plugs may comprise a material having a different resistivity than the first contact plugs.

In further embodiments of the present invention, the lower interlayer dielectric layer comprises a first insulating layer and a first chemical mechanical polishing (CMP) stopper layer on the first insulating layer. The first CMP stopper layer may comprise a silicon nitride layer. The middle interlayer dielectric layer may comprise a second insulating layer and a second CMP stopper layer on the second insulating layer. The second CMP stopper layer may comprise a silicon nitride layer.

In some embodiments, each of the first phase changeable data storage elements comprises a first phase changeable material layer pattern and a first top electrode on the first phase changeable material layer, and each of the second phase changeable data storage elements comprises a second phase changeable material layer pattern and a second top electrode on the second phase changeable material layer. The first and second phase changeable material layer patterns may comprise a compound material comprising germanium (Ge), tellurium (Te) and stibium (Sb). The first and second top electrodes may each comprise a titanium nitride (TiN) layer.

The phase changeable memory may further include an upper interlayer dielectric layer interposed between the plate electrode and the second phase changeable data storage elements. The plate electrode is electrically connected to the first phase changeable data storage elements through first metal contact holes that penetrate the upper interlayer dielectric layer and the middle interlayer dielectric layer. The plate electrode is electrically connected to the second phase changeable data storage elements through second metal contact holes that penetrate the upper interlayer dielectric layer.

Related fabrication methods are also discussed.

BRIEF DESCRIPTION OF THE DRAWINGS

Other features and advantages of the present invention will be more readily understood from the following detailed description of specific embodiments thereof when read in conjunction with the accompanying drawings, in which:

FIGS. 5B, 6B, 7B, 8B, 9B and 10B are cross sectional views, taken along a line II–II' of FIG. 4, illustrating operations for fabricating phase changeable memory devices according to some embodiments of the present invention;

DETAILED DESCRIPTION

Figure 1:
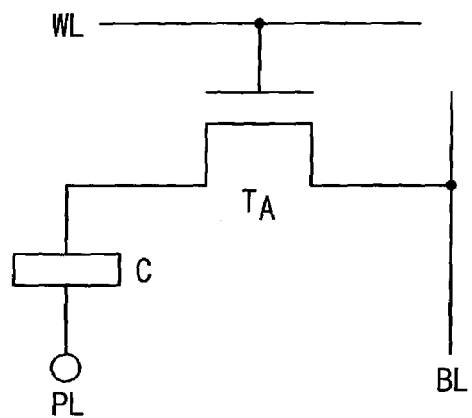
FIG. 1 is an equivalent circuit diagram of a unit cell of a typical conventional phase changeable memory device.
Figure 2:
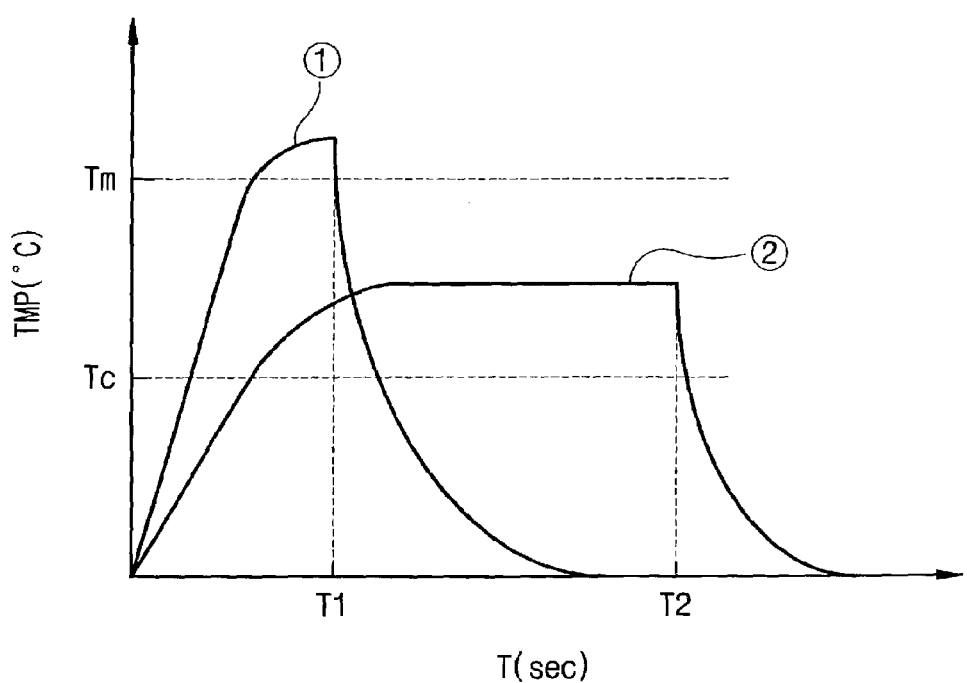
FIG. 2 is a graph illustrating a typical characteristic of a phase changeable material as conventionally employed in cells of a phase changeable memory device.
Figure 3:
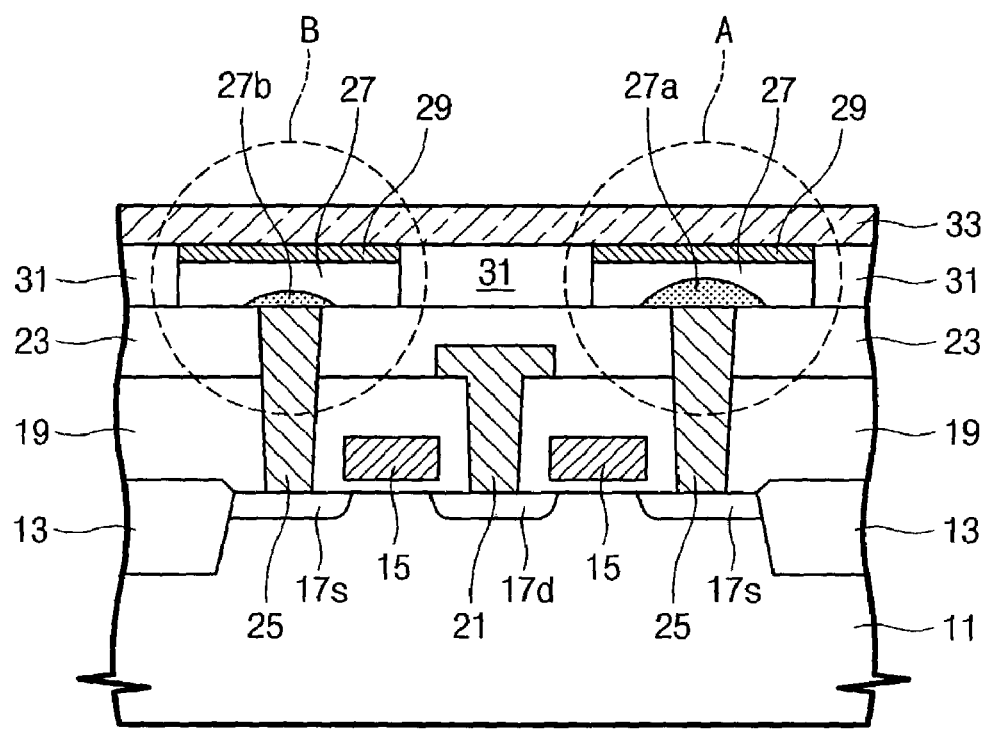
FIG. 3 is a cross sectional view showing conventional phase changeable memory cells.

The present invention now will be described more fully hereinafter with reference to the accompanying drawings, in which typical embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. In the drawings, the relative sizes of regions may be exaggerated for clarity.

It will be understood that when an element such as a layer, region or substrate is referred to as being "on" another element, it can be directly on the other element or intervening elements may also be present. In contrast, when an element is referred to as being "directly on" another element, there are no intervening elements present.

Figure 4:
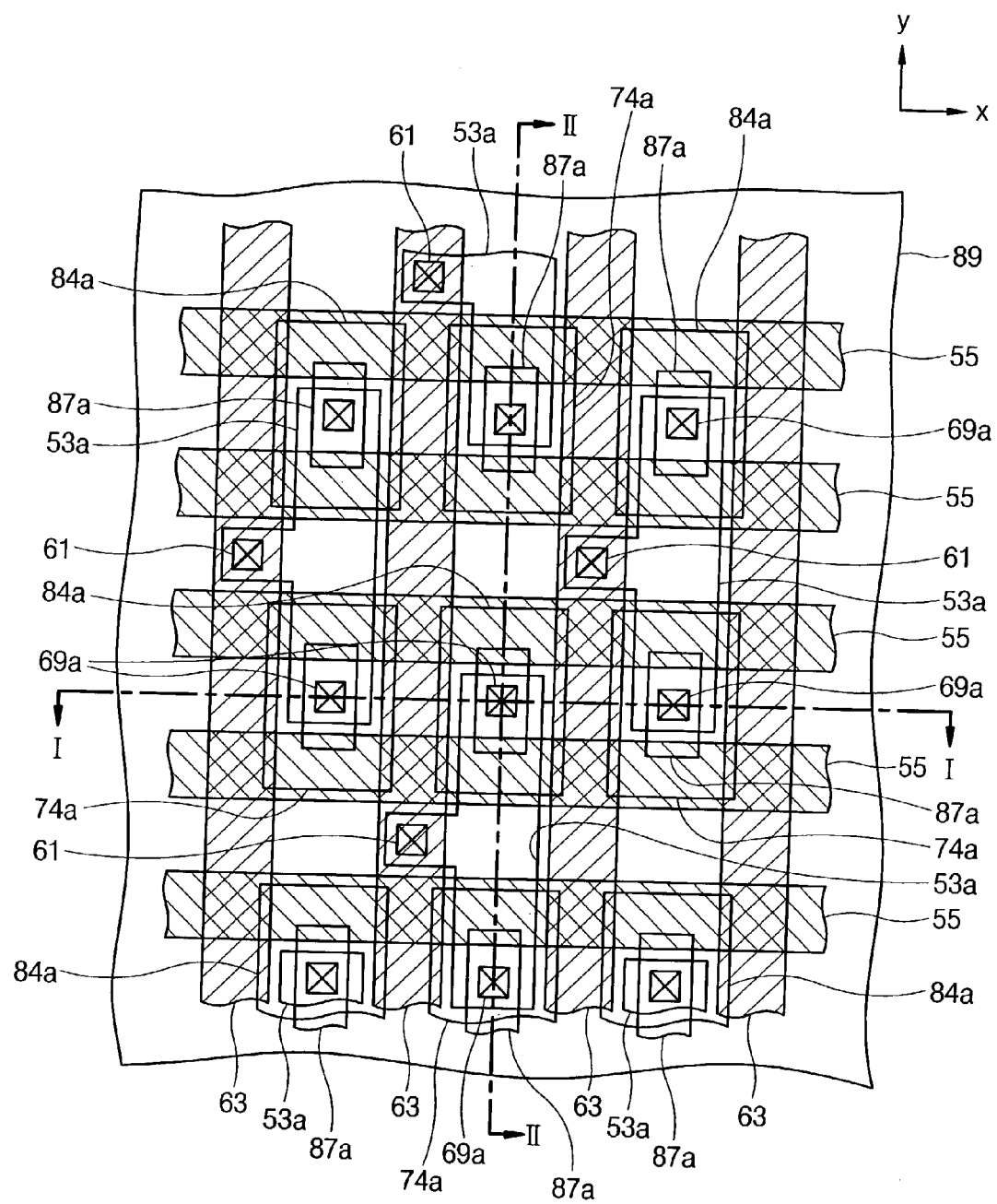
FIG. 4 is a top plan view showing a cell array region of a phase changeable memory device according to some embodiments of the present invention.

FIG. 4 is a top plan view illustrating a portion of a cell array region of a phase changeable memory device according to some embodiments of the present invention. A plurality of active regions 53a is two dimensionally arrayed in a semiconductor substrate. A plurality of parallel word lines 55 is disposed across the active regions 53a. The word lines 55 run in parallel with the x-axis. Each of the active regions 53a intersects a pair of word lines 55, thus dividing the respective active regions 53a into three regions. The active region 53a between the pair of word lines 55 serve as common drain regions, and the ends of the active regions 53a serve as source regions. The source regions are located at the positions that rows and columns defined by intersections of the word lines 55 and bit lines 53. The rows are parallel with the x-axis, and the columns are parallel with y-axis. The common drain regions are electrically connected to the bit lines 63 through bit line contact holes 61.

A plurality of phase changeable data storage elements is two dimensionally arrayed over the source regions. The phase changeable data storage elements comprise first phase changeable data storage elements 74a and second phase changeable data storage elements 84a. The first and second phase changeable data storage elements 74a, 84a are arrayed in rows and columns such that the respective first phase changeable data storage elements 74a are disposed between respective adjacent second phase changeable data storage elements 84a in the rows and columns. In the exemplary embodiments of FIG. 4, the first phase changeable data storage elements 74a are located at the positions where even rows and even columns intersect and where odd rows and odd columns intersect, and the second phase changeable data storage elements 84a are located at the positions that the even rows and the odd columns intersect and the odd rows and the even columns intersect.

The first phase changeable data storage elements 74a are electrically connected to the source regions thereunder through first contact holes 69a. The second phase changeable data storage elements 84a may be electrically connected to the source regions thereunder through first contact holes 69a and second contact holes (not shown) that underlie the first contact holes 69a. Alternatively, the second phase changeable data storage elements 84a may be electrically connected to the source regions thereunder through second contact holes that are deeper than the first contact holes 69a. The second phase changeable data storage elements 84a are located at a higher level than the first phase changeable data storage elements 74a. Top surfaces of the first and second phase changeable data storage elements 74a and 84a are electrically connected to a plate electrode 89 through metal contact holes 87a.

Operations for fabricating cells of a phase changeable memory device according to some embodiments of the present invention will now be explained with reference to FIGS. 5A–10B. In particular, FIGS. 5A, 6A, 7A, 8A, 9A and 10A are cross sectional views taken along a line I–I' of FIG. 4, and FIGS. 5B, 6B, 7B, 8B, 9B and 10B are cross sectional views taken along a line II–II' of FIG. 4.

Figure 5A:
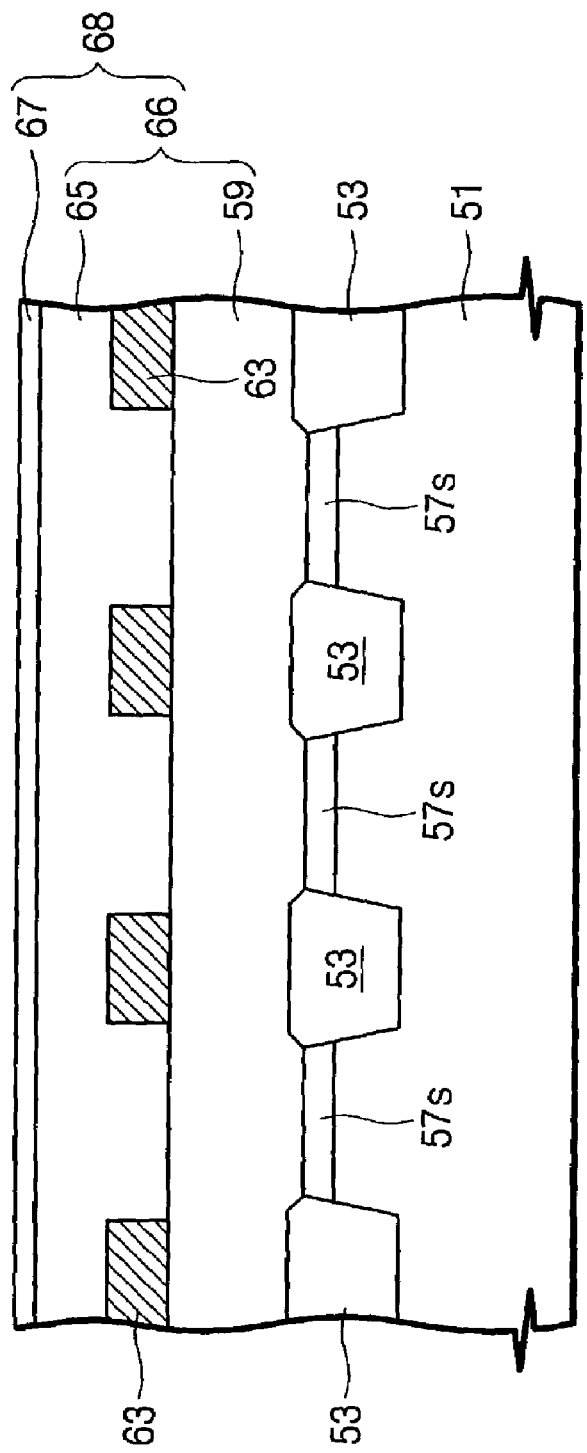
FIGS. 5A, 6A, 7A, 8A, 9A and 10A are cross sectional views, taken along a line I–I' of FIG. 4, illustrating operations for fabricating phase changeable memory devices according to some embodiments of the present invention.
Figure 5B:
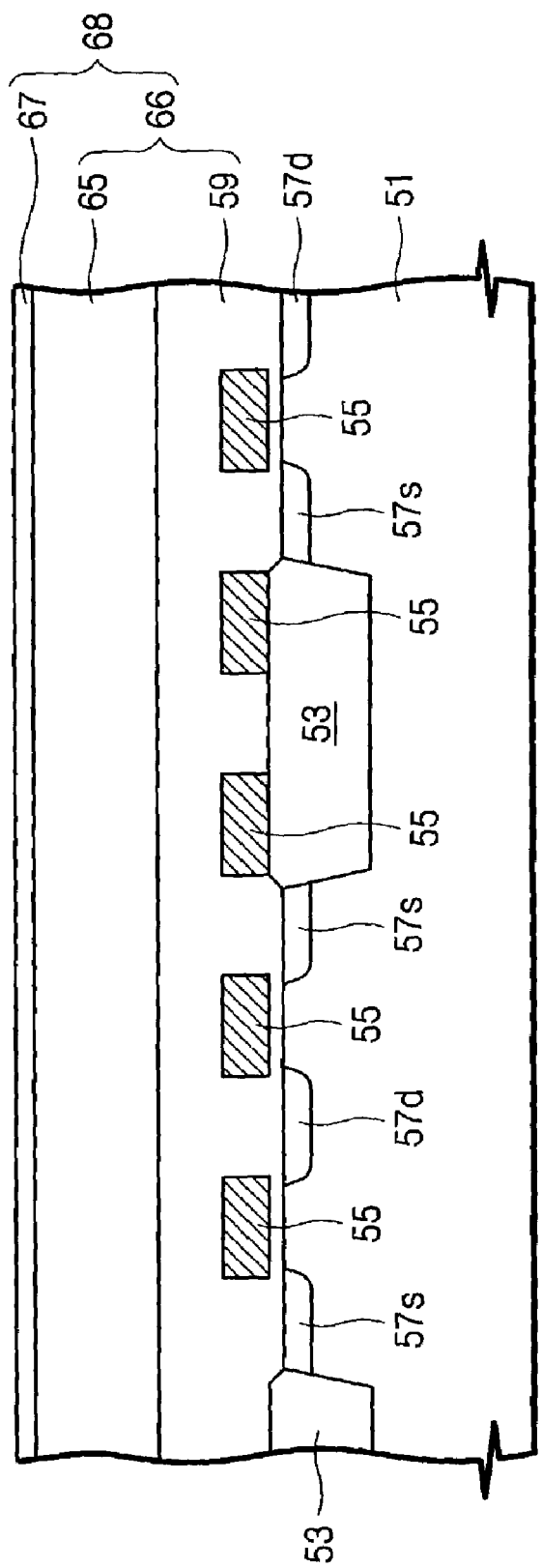

Referring to FIGS. 4, 5A and 5B, an isolation layer 53 is formed in a semiconductor substrate 5 to define a plurality of active regions 53a. The active regions 53a are two dimensionally arrayed as shown in FIG. 4. A plurality of parallel word lines 55 is formed on the substrate, crossing the active regions 53a. The word lines 55 are insulated from the active regions 53a by a gate insulation layer (not shown). The word lines 55 run parallel to x-axis shown in FIG. 4.

Impurity ions are implanted into the active regions 53a using the word lines 55 and the isolation layer 53 as ion implantation masks. As a result, a pair of source regions 57s is formed at respective active regions 53a, and a common drain region 57d is formed between the pair of source regions 57s. The source regions 57s are two dimensionally arrayed on the semiconductor substrate 51.

A first lower insulating layer 59 is formed on the substrate including the common drain regions 57d and the source regions 57s. The first lower insulating layer 59 preferably comprises a silicon oxide layer. The first lower insulating layer 59 is patterned to form a plurality of bit line contact holes (61 of FIG. 4) that expose the common drain regions 57d. A conductive layer is then formed on the substrate, and the conductive layer is patterned to a plurality of parallel bit lines 63 that cover the bit line contact holes 61. The bit lines 63 run parallel to the y-axis shown in FIG. 4. The bit lines 63 are electrically connected to the common drain regions 57d through the bit line contact holes 61.

A first upper insulating layer 65 and a first chemical mechanical polishing (CMP) stopper layer 67 are sequentially formed on the substrate including the bit lines 63. The first upper insulating layer 65 preferably comprises a silicon oxide layer, and the first CMP stopper layer 67 preferably comprises a silicon nitride layer. The first lower insulating layer 59 and the first upper insulating layer 65 form a first insulating layer 66. The first insulating layer 66 and the first CMP stopper layer 67 form a lower interlayer dielectric layer 68.

Figure 6A:
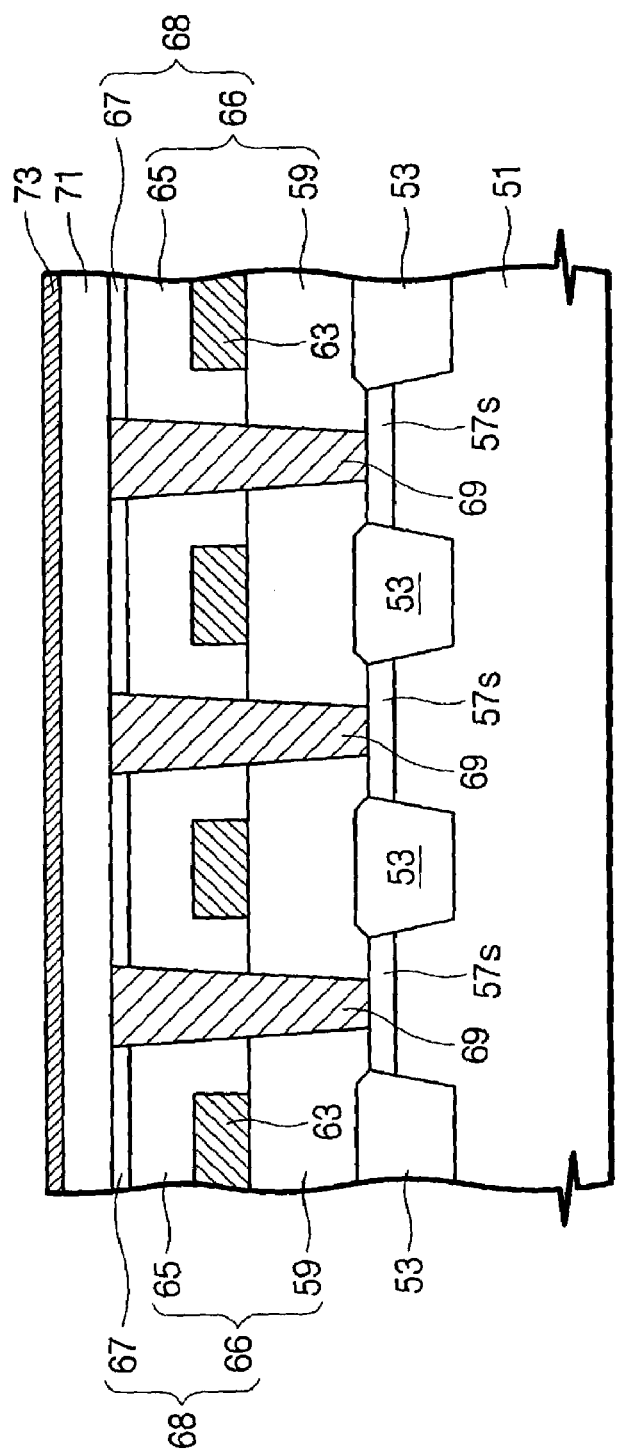
Figure 6B:
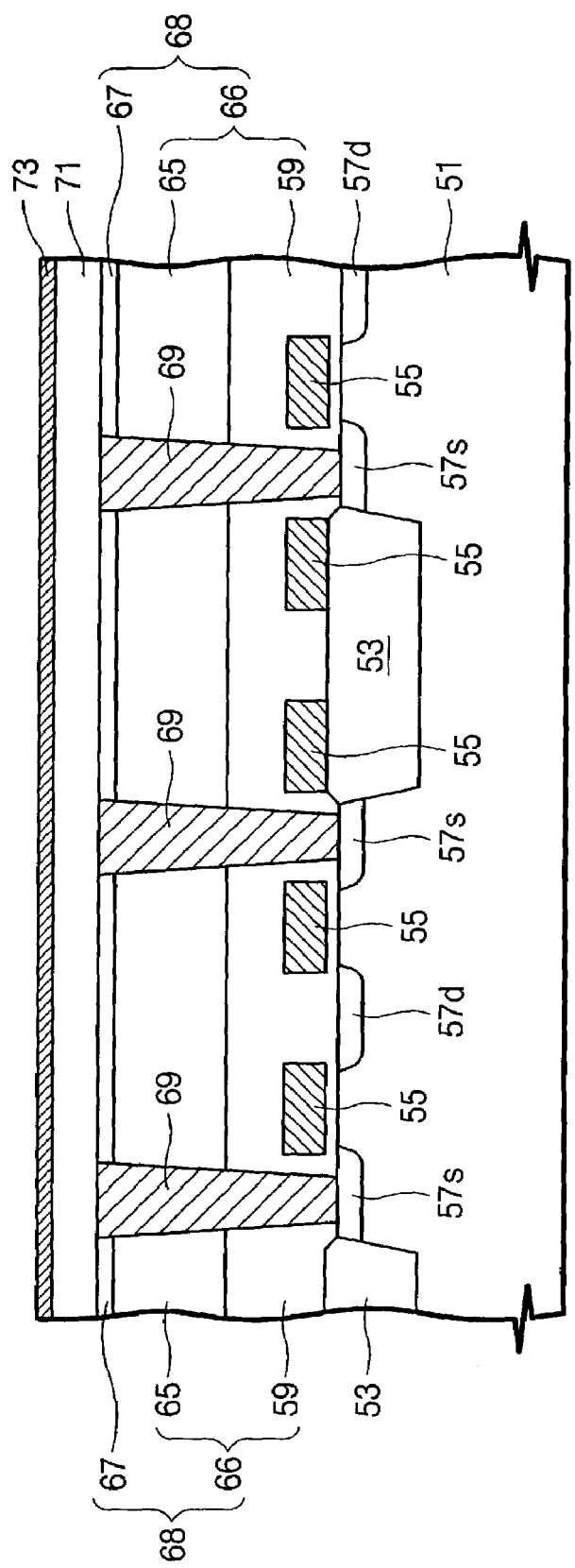

Referring to FIGS. 4, 6A and 6B, the lower interlayer dielectric layer 68 is patterned to form a plurality of first contact holes (69a of FIG. 4) that expose the source regions 57s. A conductive layer is formed on the substrate having the first contact holes 69a. The conductive layer preferably comprises titanium nitride (TiN), titanium aluminum nitride (TiAlN), titanium silicon nitride (TiSiN), tantalum aluminum nitride (TaAlN) and/or tantalum silicon nitride (TaSiN). The conductive layer is planarized until the first CMP stopper layer 67 is exposed, thereby forming first contact plugs 69 in the first contact holes 69a. The planarization process may be performed using a CMP technique.

The first contact plugs 69 comprise first and second groups of contact plugs. The first group of contact plugs are formed at positions where even rows and the even columns intersect and where odd rows and odd columns intersect. The second group of contact plugs are formed at positions where even rows and odd columns intersect and where odd rows and even columns intersect. A first phase changeable material layer 71 and a first conductive layer 73 are sequentially formed on the substrate having the first contact plugs 69. The first phase changeable material layer 71 may comprise a GTS layer. Also, the first conductive layer 73 may comprise a titanium nitride (TiN) layer.

Figure 7A:
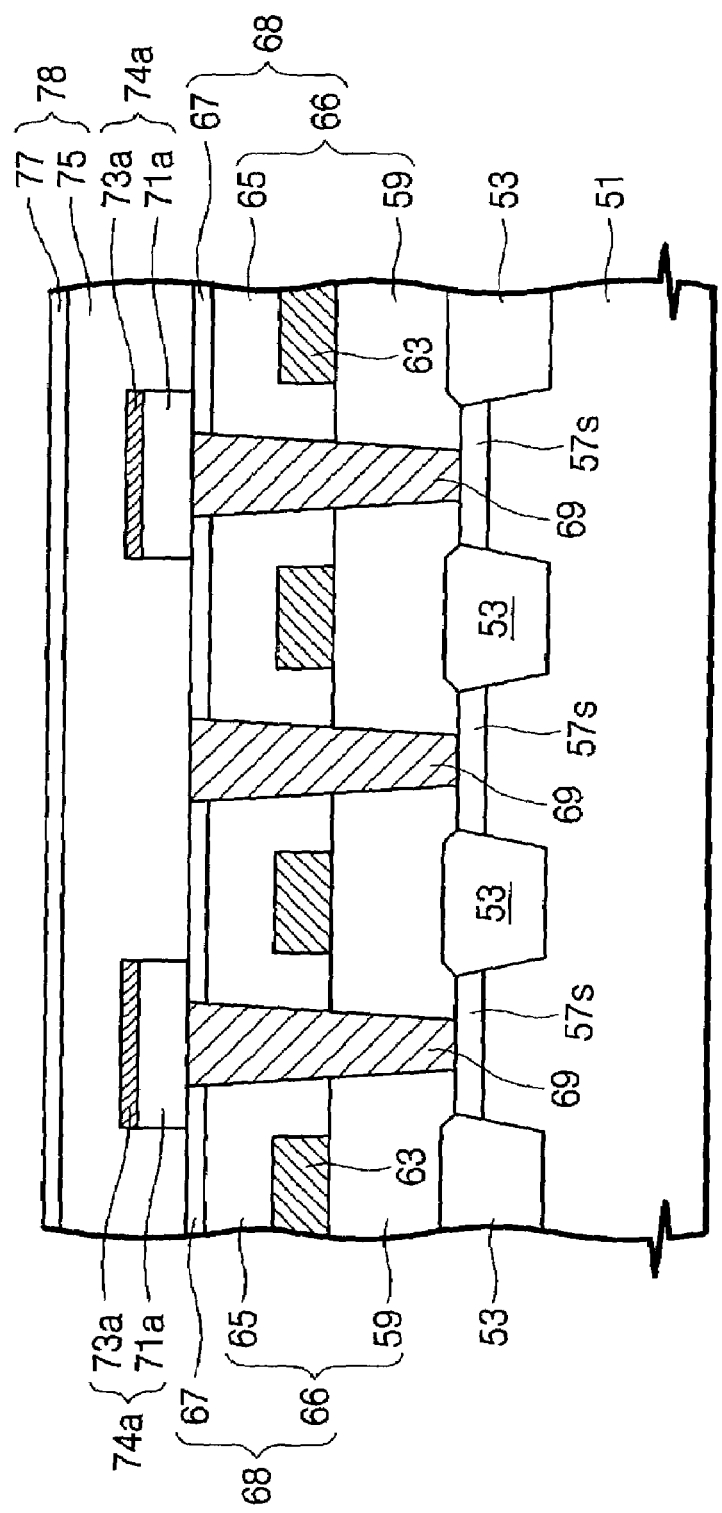
Figure 7B:
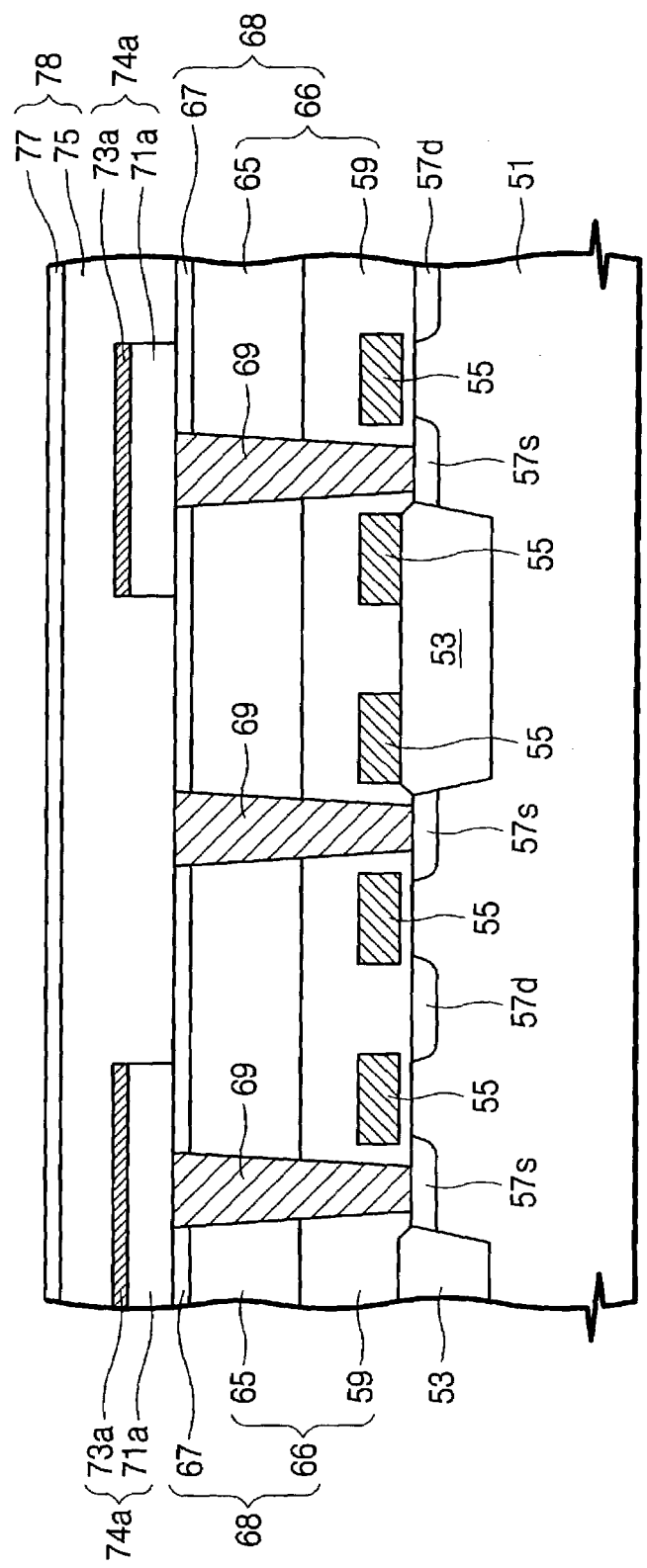

Referring to FIGS. 4, 7A and 7B, the first conductive layer 73 and the first phase changeable material layer 71 are successively patterned to form first phase changeable data storage elements 74a, which are two dimensionally arrayed on the lower interlayer dielectric layer 68. Each of the first phase changeable data storage elements 74a comprises a first phase changeable material layer pattern 71a and a first top electrode 73a. In addition, the first phase changeable data storage elements 74a are formed at the positions where even rows and even columns intersect and where odd rows and odd columns intersect. Thus, the first phase changeable material layer patterns 71a contact with the first group of contact plugs.

A middle interlayer dielectric layer 78 is formed on the substrate including the first phase changeable data storage elements 74a. It is preferable that the middle interlayer dielectric layer 78 be formed by sequentially forming a second insulating layer 75 and a second CMP stopper layer 77. The second insulating layer 75 preferably comprises a silicon oxide layer, and the second CMP stopper layer 77 preferably comprises a silicon nitride layer.

Figure 8A:
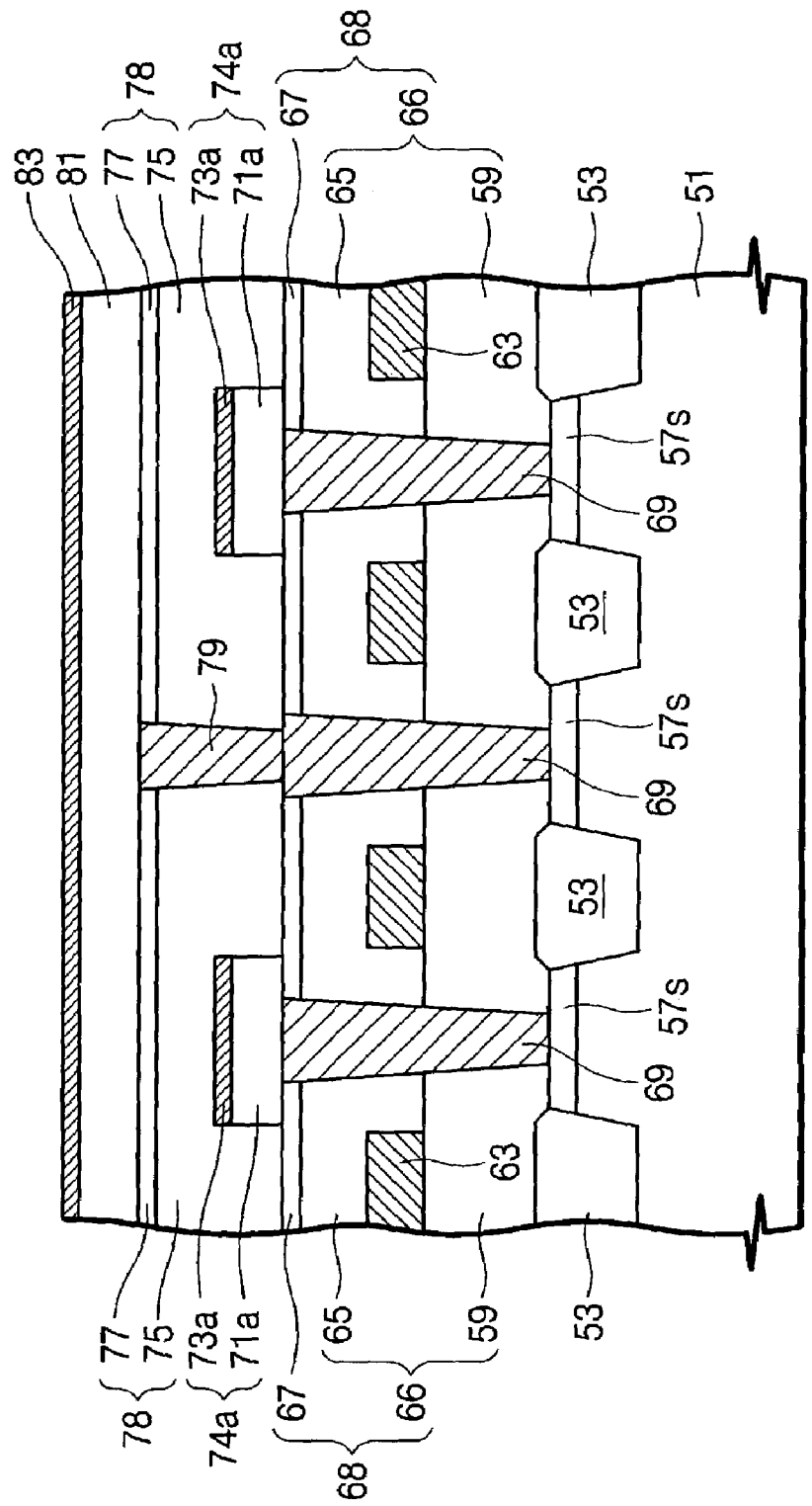
Figure 8B:
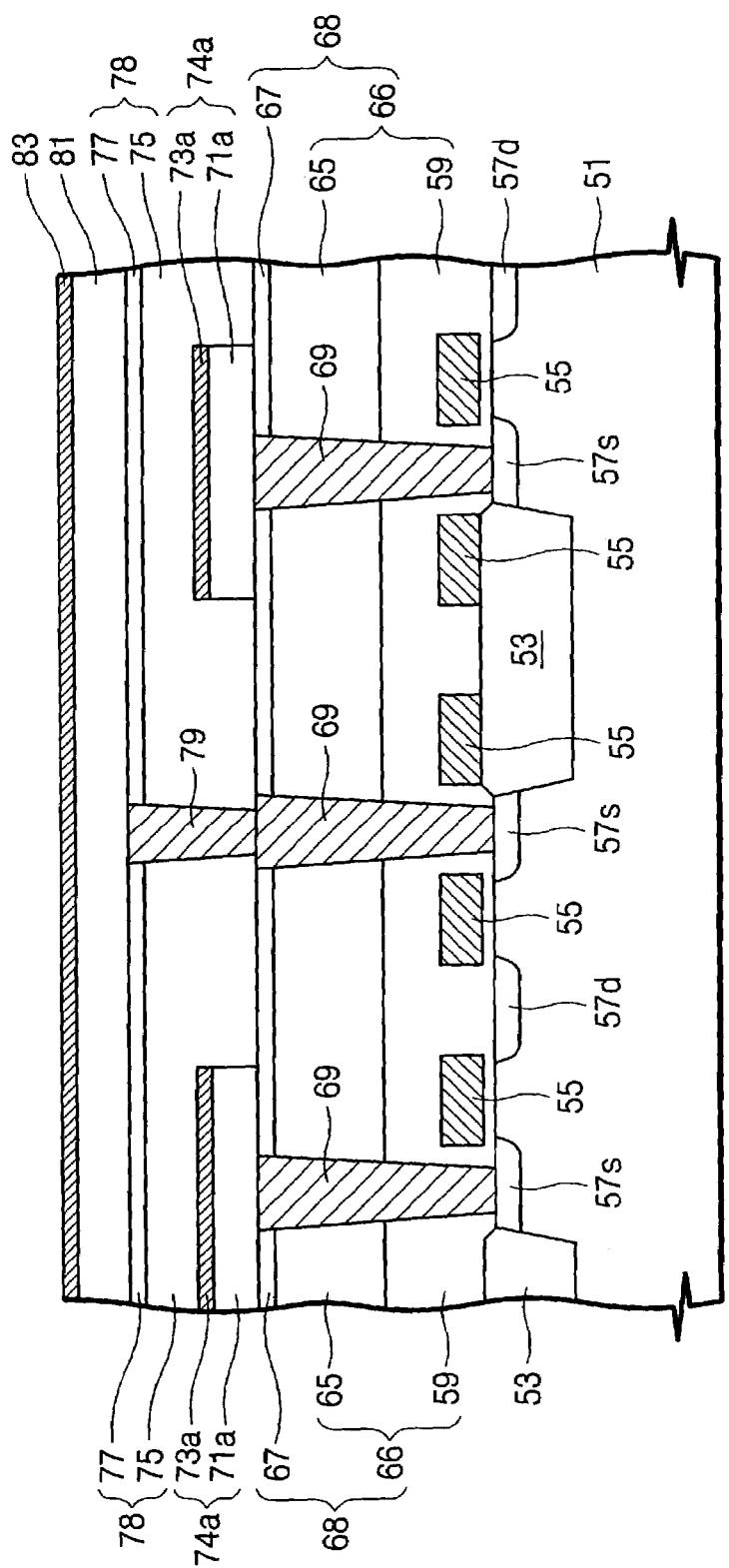

Referring to FIGS. 4, 8A and 8B, the middle interlayer dielectric layer 78 is patterned to form second contact holes that expose the second group of contact plugs. It is preferable that diameters of the second contact holes are smaller than diameters of the first contact holes 69a, in order to provide a desirable alignment margin during a photolithography process for forming the second contact holes. A conductive layer is then formed on the substrate having the second contact holes. The conductive layer preferably comprises TiN, TiAlN, TiSiN, TaAlN and/or TaSiN.

The conductive layer is planarized until the second CMP stopper layer 77 is exposed, thereby forming second contact plugs 79 in the second contact holes. The second contact plugs 79 are formed at positions where even rows and odd columns intersect and where odd rows and even columns intersect. A second phase changeable material layer 81 and a second conductive layer 83 are sequentially formed on an entire surface of the substrate having the second contact plugs 79. The second phase changeable material layer 81 is preferably formed from the same material layer as the first phase changeable material layer 71, and the second conductive layer 83 is preferably formed from the same material layer as the first conductive layer 73.

Figure 9A:
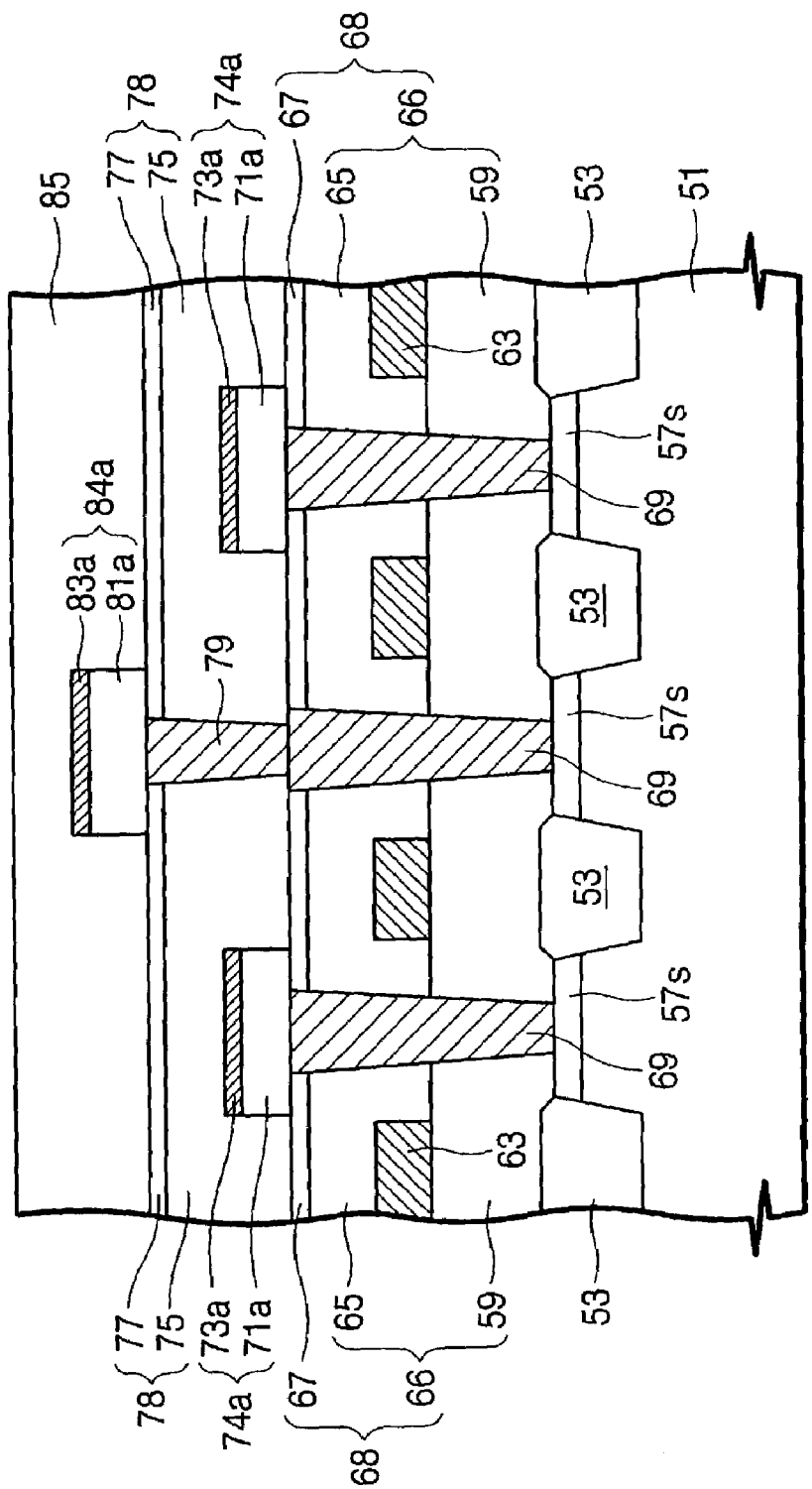

Referring to FIGS. 4, 9A and 9B, the second conductive layer 83 and the second phase changeable material layer 81 are successively patterned to form a plurality of second phase changeable data storage elements 84a that cover the second contact plugs 79. The second phase changeable data storage elements 84a are located at positions where the even rows and the odd columns intersect and where the odd rows and the even columns intersect. Each of the second phase changeable data storage elements 84a comprises a second phase changeable material layer pattern 81a and a second top electrode 83a. An upper interlayer dielectric layer 85 is formed on the substrate having the second phase changeable data storage elements 84a.

Figure 10A:
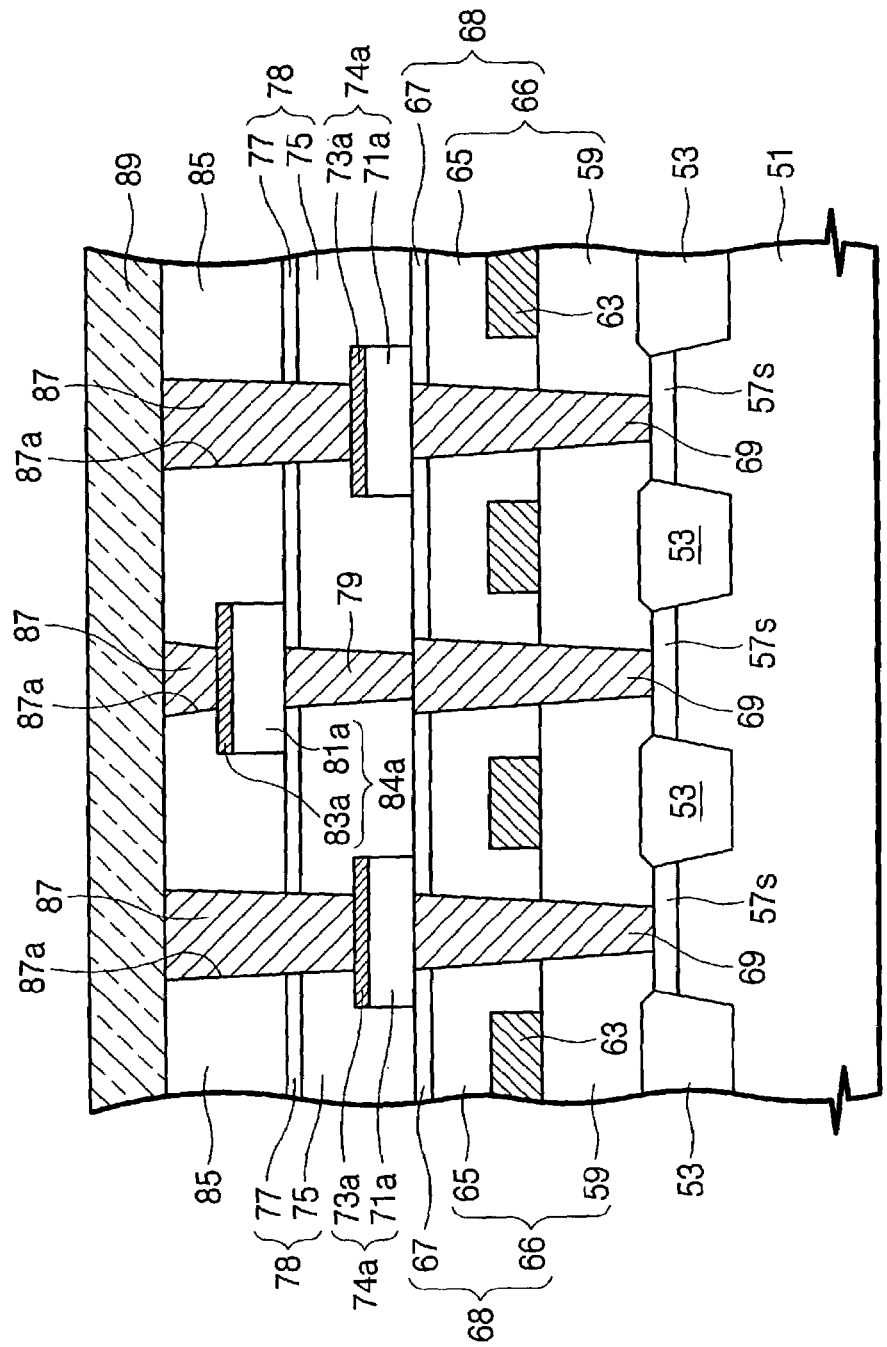
Figure 10B:
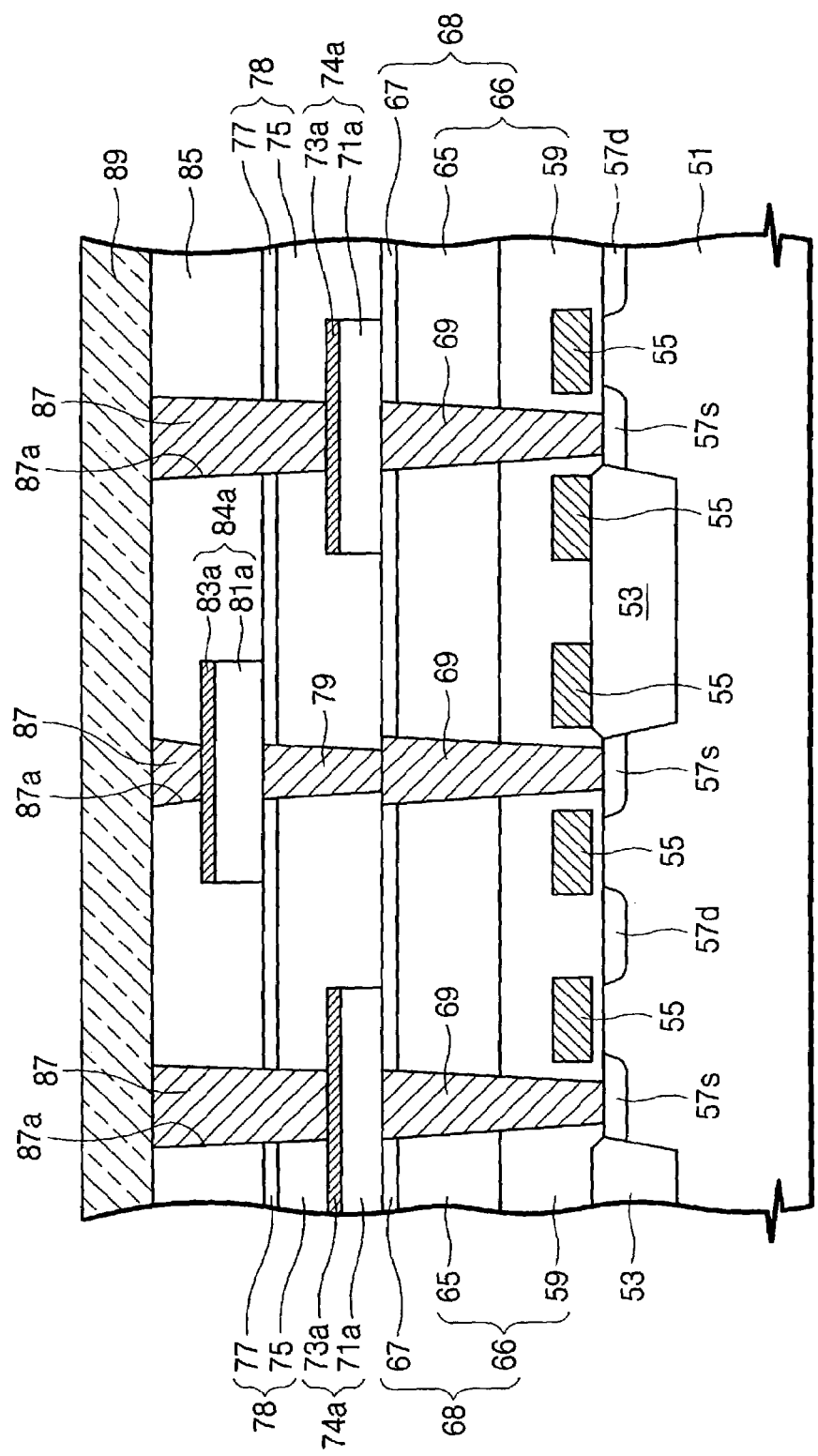

Referring to FIGS. 4, 10A and 10B, the upper interlayer dielectric layer 85 and the middle interlayer dielectric layer 78 are successively patterned to a plurality of metal contact holes 87a that expose the first and second top electrodes 73a and 83a. Metal contact plugs 87 are formed in the metal contact holes 87a using, for example, conventional techniques. A plate electrode 89 is formed on the substrate including the metal contact plugs 87. The process for forming the metal contact plugs 87 may be omitted, and the plate electrode 89 may be electrically connected to the first and second top electrodes 73a and 83a through the metal contact holes 87a.

According to embodiments of the invention described above, first and second phase changeable data storage elements that are adjacent to each other are formed at different levels. Thus, heat conduction between the adjacent phase changeable data storage elements may be reduced in comparison to conventional art.

Figure 11A:
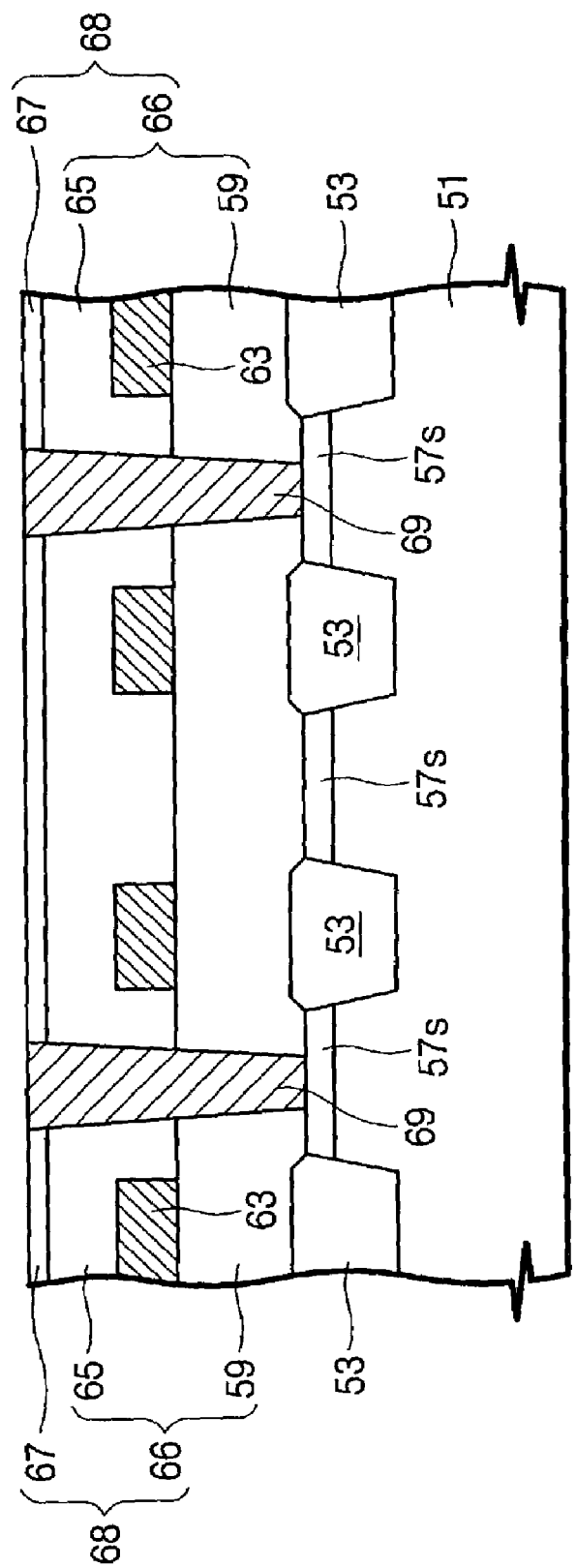
FIGS. 11A and 12A are cross sectional views, taken along a line I–I' of FIG. 4, illustrating operations for fabricating phase changeable memory devices according to further embodiments of the present invention.
Figure 11B:
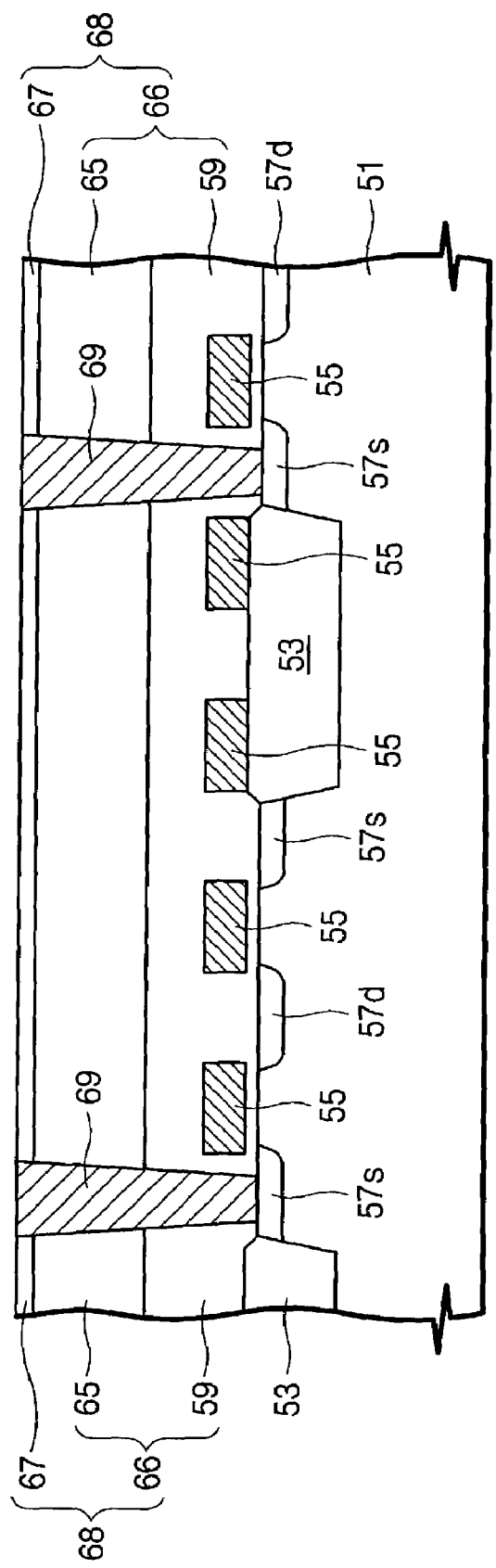
FIGS. 11B and 12B are cross sectional views, taken along a line II–II' of FIG. 4, illustrating operations for fabricating phase changeable memory device according to further embodiments of the present invention.
Figure 12A:
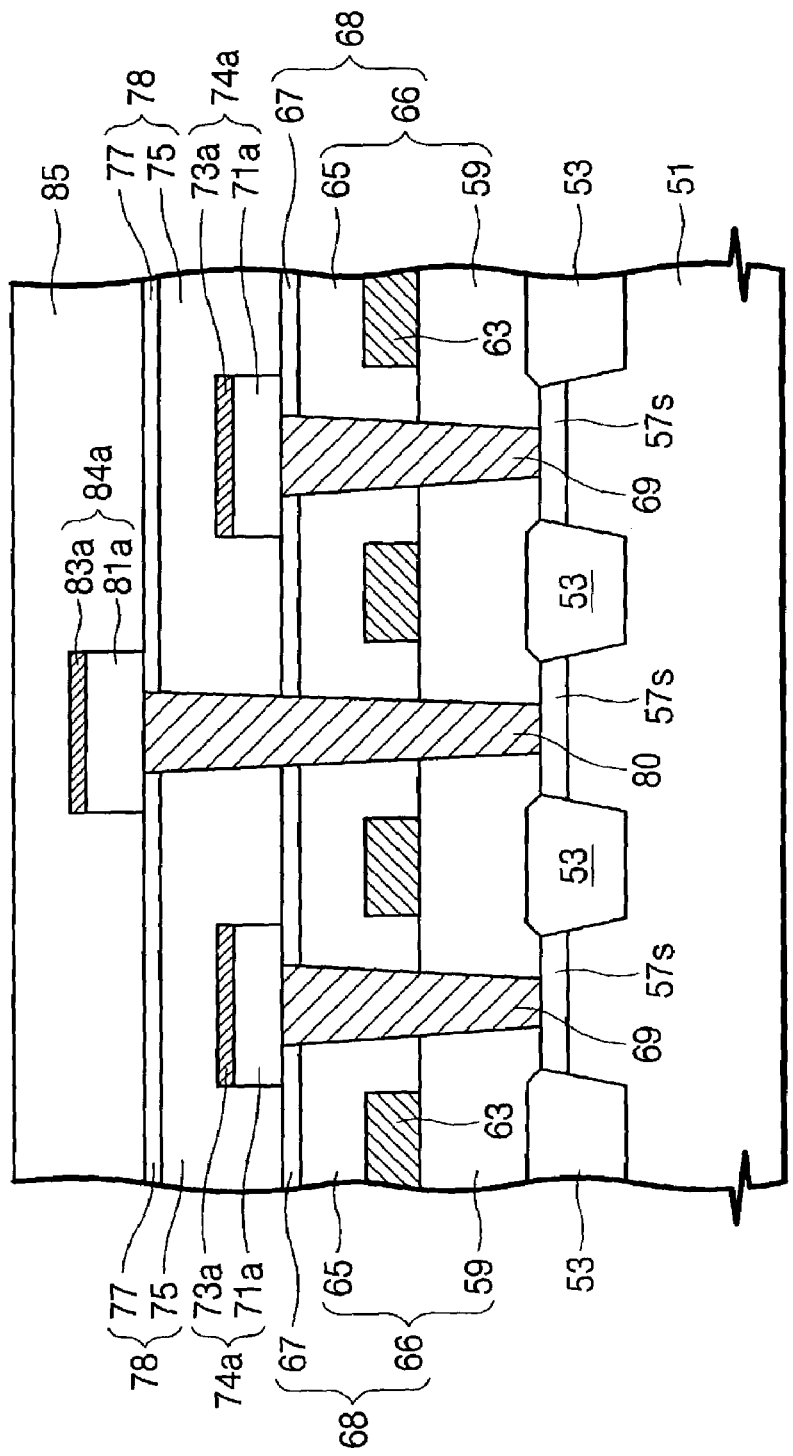
Figure 12B:
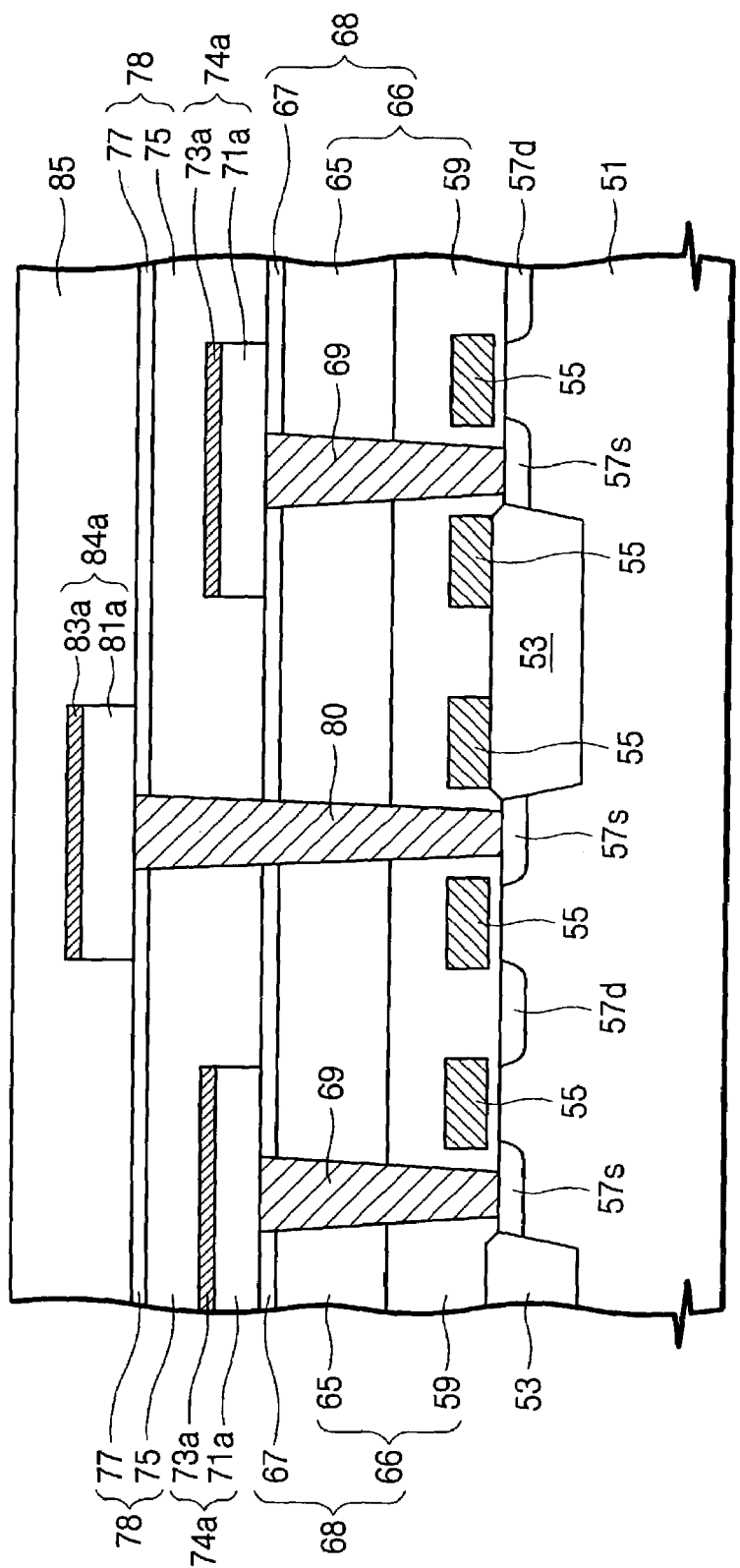

FIGS. 11A, 11B, 12A and 12B are cross sectional views illustrating operations for fabricating cells of a phase changeable memory device in accordance with further embodiments of the present invention. FIGS. 11A and 12A are cross sectional views taken along the line I–I' of FIG. 4, and FIGS. 11B and 12B are cross sectional views taken along the line II–II' of FIG. 4. In these embodiments, first and second contact plugs are formed using different operations than describe for the previously described embodiments.

Referring to FIGS. 11A and 11B, an isolation layer 53, word lines 55, common drain regions 57d, source regions 57s and lower interlayer dielectric layer 68 are formed using the manner described above. The source regions 57s are two dimensionally arrayed in rows and columns. The source regions 57s comprise a first group of source regions and a second group of source regions. The first group of source regions is formed at the positions where even rows and even columns intersect and where odd rows and odd columns intersect. The second group of source regions is formed at the positions where the even rows and the odd columns intersect and where the odd rows and the even columns intersect. The lower interlayer dielectric layer 68 is patterned to form first contact holes that expose only the first group of source regions. First contact plugs 69 are formed in the first contact holes in the same manner as the above-described embodiments.

Referring to FIGS. 12A and 12B, a plurality of first phase changeable data storage elements 74a are formed on the first contact plugs 69 using the same method as the above-described embodiments. A middle interlayer dielectric layer 78 is formed on the substrate having the first phase changeable data storage elements 74a. The middle interlayer dielectric layer 78 and the lower interlayer dielectric layer 68 are successively patterned to form a plurality of second contact holes that expose the second group of source regions. Second contact plugs 80 are formed in the second contact holes in the same manner as the above-described embodiments, except that the second contact plugs 80 are preferably formed from a different conductive layer than the first contact plugs 69. For example, if the diameter of the first contact holes is equal to that of the second contact holes, the second contact plugs 80 are preferably formed of a conductive layer that has a lower resistivity than the first contact plugs 69, such that the second contact plugs 80 have substantially the same electrical resistance as the first contact plugs 69. In this case, substantial writing uniformity throughout all of the cells can be achieved.

A plurality of second phase changeable data storage elements 84a can be formed on the substrate having the second contact plugs 80 using the same operations as used for the above-described embodiments. Therefore, the second phase changeable data storage elements 84a are electrically connected to the second group of source regions 57s through only the second contact plugs 80. An upper interlayer dielectric layer 85 is formed on the substrate including the second phase changeable data storage elements 84a. Subsequently, metal contact plugs and a plate electrode can be formed in the same manner as the above-described embodiments.

Figure 13:
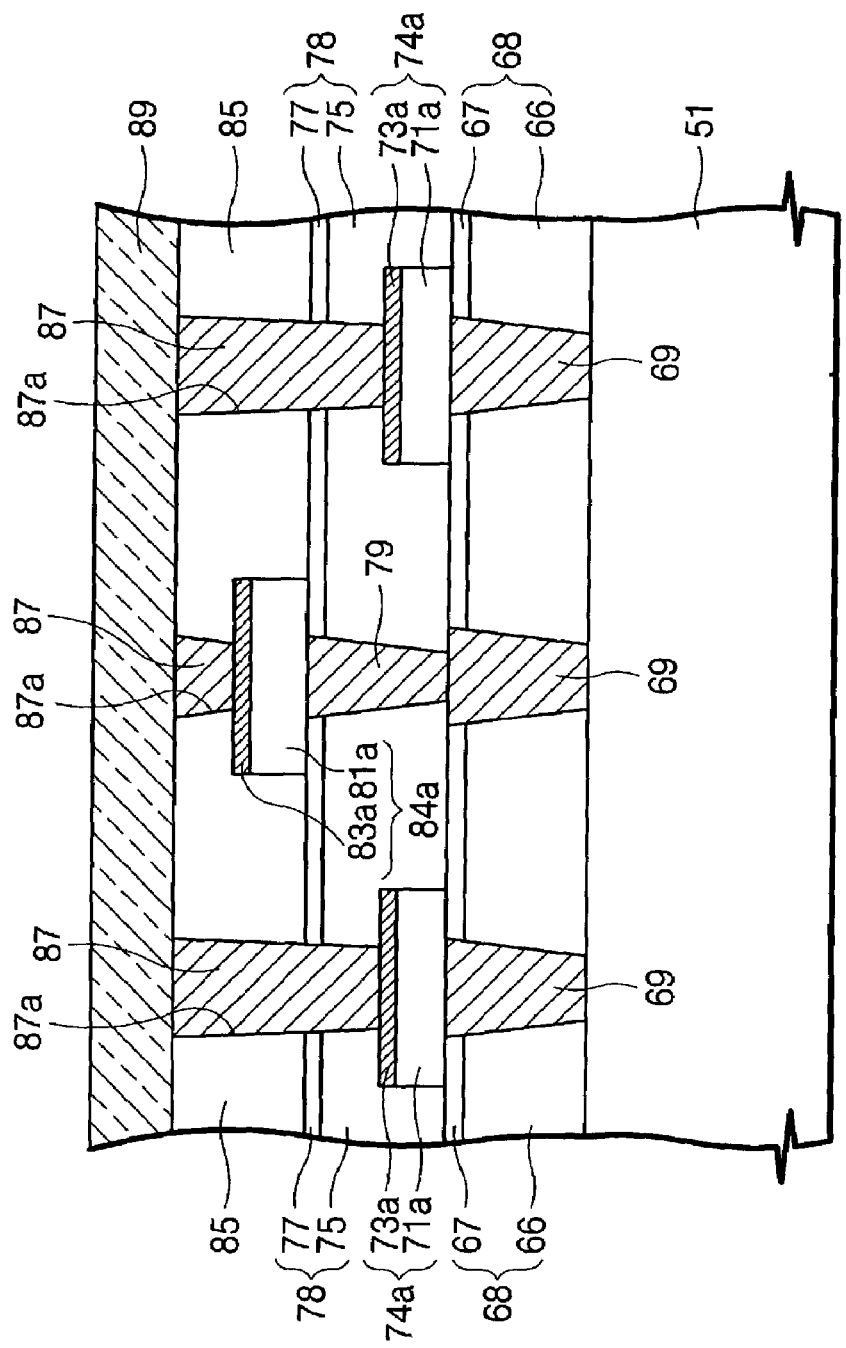
FIG. 13 is a cross sectional view of a phase changeable memory device according to some embodiments of the present invention.

FIG. 13 is a cross-sectional view for illustrating a cell structure of the phase changeable memory device fabricated according to the first-described embodiments of the present invention. A main surface of a semiconductor substrate 51 is covered with a lower interlayer dielectric layer 68. The lower interlayer dielectric layer 68 comprises a first insulating layer 66 and a first CMP stopper layer 67. It is preferable that the first CMP stopper layer 67 is a silicon nitride layer. A plurality of first contact plugs 69 pass through the lower interlayer dielectric layer 68. The first contact plugs 69 are two dimensionally arrayed along rows and columns and are in contact with the semiconductor substrate 51. The first contact plugs comprise a first group of first contact plugs and a second group of contact plugs. The first group of first contact plugs is located at the positions where even rows and even columns intersect and where odd rows and odd columns intersect. The second group of first contact plugs is located at the positions where the even rows and the odd columns intersect and where the odd rows and the even columns intersect.

The first group of first contact plugs is covered with a plurality of first phase changeable data storage elements 74a. As a result, the first phase changeable data storage elements 74a are located at the positions where the even rows and the even columns intersect and where the odd rows and the odd columns intersect. Each of the first phase changeable data storage elements 74a comprises a first phase changeable material layer pattern 71a and a first top electrode 73a. The surface of the substrate including the first phase changeable data storage elements 74a is covered with a middle interlayer dielectric layer 78. The middle interlayer dielectric layer 78 comprises a second insulating layer 75 and a second CMP stopper layer 77. Preferably, the second CMP stopper layer 77 is a silicon nitride layer.

A plurality of second contact plugs 79 pass through the middle interlayer dielectric layer 78. The second contact plugs 79 are in contact with the second group of first contact plugs. Therefore, the second contact plugs 79 are located at the positions where the even rows and the odd columns intersect and where the odd rows and the even columns intersect. The second contact plugs 79 are covered with a plurality of second phase changeable data storage elements 84a, which are two dimensionally arrayed. The second phase changeable data storage elements 84a are located at the positions where the even rows and the odd columns intersect and where the odd rows and the even columns intersect. Each of the second phase changeable data storage elements 84a comprises a second phase changeable material layer pattern 81a and a second top electrode 83a, which are sequentially stacked. The surface of the substrate including the second phase changeable data storage elements 84a is covered with an upper interlayer dielectric layer 85.

A plate electrode 89 is disposed on the upper interlayer dielectric layer 85. The plate electrode 89 is electrically connected to the first and second top electrodes 73a and 83a through a plurality of metal contact holes 87a that penetrate the upper interlayer dielectric layer 85 and the middle interlayer dielectric layer 78. The metal contact holes 87a may be filled with metal contact plugs 87.

Figure 14:
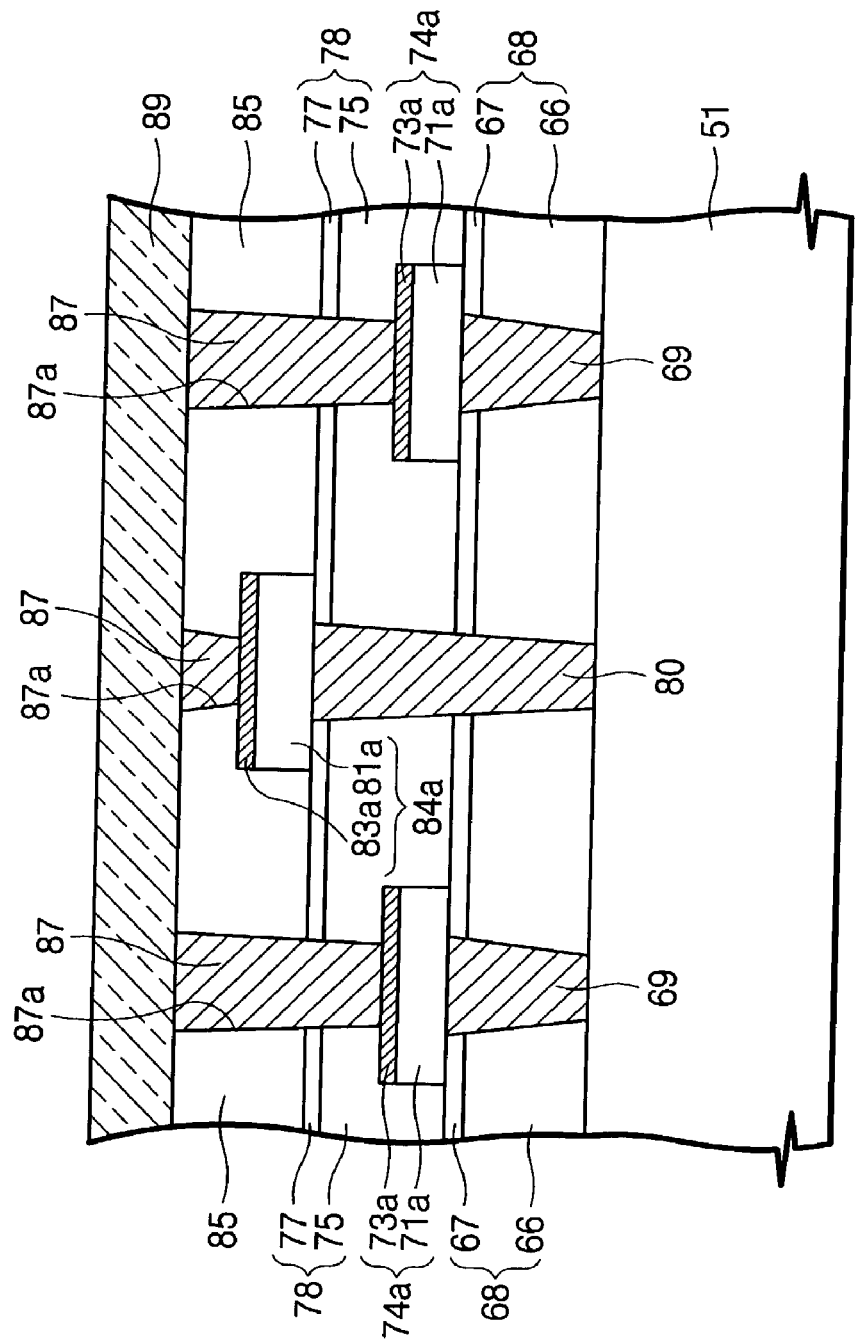
FIG. 14 is a cross sectional view of a phase changeable memory device according to further embodiments of the present invention.

FIG. 14 is a cross-sectional view for illustrating a cell structure of the phase changeable memory device fabricated according to some embodiments of the present invention. This embodiment is different from the embodiments shown in FIG. 13 with respect to the structural configurations of the first and second contact plugs.

Referring to FIG. 14, a lower interlayer dielectric layer 68 is disposed on a semiconductor substrate 51. A plurality of first contact plugs 69 pass through the lower interlayer dielectric layer 68. The first contact plugs 69 are located at the positions that even rows and even columns intersect and odd rows and odd columns intersect. The first contact plugs 69 are covered with first phase changeable data storage elements 74a. The first phase changeable data storage elements 74a have the same configuration as those of the embodiments of FIG. 13. The substrate including the first phase changeable data storage elements 74a is covered with a middle interlayer dielectric layer 78. A plurality of second contact plugs 80 pass through the middle interlayer dielectric layer 78 and the lower interlayer dielectric layer 68. The second contact plugs 80 are two dimensionally arrayed. The second contact plugs 80 are located at the positions where the even rows and the odd columns intersect and where odd rows and the even columns intersect.

The second contact plugs 80 are covered with a plurality of second phase changeable data storage elements 84a. The second phase changeable data storage elements 84a have the same configuration as those of the embodiments of FIG. 13. The substrate including the second phase changeable data storage elements 84a is covered with an upper interlayer dielectric layer 85. A plate electrode 89 is disposed on the upper interlayer dielectric layer 85. The plate electrode 89 is electrically connected to the first and second top electrodes 73a and 83a through a plurality of metal contact holes 87a like the embodiment of FIG. 13.

According to the embodiments of the present invention described herein, first and second phase changeable data storage elements are arrayed in rows and columns such that respective first phase changeable data storage elements are disposed between respective adjacent second phase changeable data storage elements in the rows and columns. The first phase changeable data storage elements are disposed at different levels than the second phase changeable data storage elements. Thus, a length of thermal conduction path between adjacent first and second phase changeable data storage elements is increased as compared with the conventional art. As a result, even though heat is generated through a contact plug that is in contact with a selected phase changeable data storage element in a write mode, the likelihood of unwanted writing of data to non-selected phase changeable data storage elements that are adjacent to the selected phase changeable data storage element can be reduced.

In the drawings and specification, there have been disclosed typical embodiments of the invention and, although specific terms are employed, they are used in a generic and descriptive sense only and not for purposes of limitation, the scope of the invention being set forth in the following claims.

What is claimed is:

1. A memory device comprising:
    a lower interlayer dielectric layer on a semiconductor substrate;
    a plurality of first phase changeable data storage elements on the lower interlayer dielectric layer;
    a middle interlayer dielectric layer covering the first phase changeable data storage elements and the lower interlayer dielectric layer;
    a plurality of second phase changeable data storage elements on the middle interlayer dielectric layer, the first and second phase changeable data storage elements being arrayed in rows and columns such that respective first phase changeable data storage elements are disposed between respective adjacent second phase changeable data storage elements in the rows and columns; and
    a plate electrode overlying the first and second phase changeable data storage elements and electrically connected to the first and second phase changeable data storage elements.

2. The memory device of claim 1, further comprising:
    a plurality of first contact plugs passing through the lower interlayer dielectric layer; and
    a plurality of second contact plugs passing through the middle interlayer dielectric layer and contacting the second phase changeable data storage elements, wherein the first contact plugs include a first group of first contact plugs that are in contact with the first phase changeable data storage elements and a second group of first contact plugs that are in contact with the second contact plugs.

3. The memory device of claim 2, wherein the first and second groups of first contact plugs are parts of the same material layer.

4. The memory device of claim 2, wherein the first contact plugs comprise at least one of TiN, TiAlN, TiSiN, TaAlN and TaSiN.

5. The memory device of claim 2, wherein the second contact plugs comprise at least one of titanium nitride (TiN), TiAlN, TiSiN, TaAlN and TaSiN.

6. The memory device of claim 1, further comprising:
a plurality of first contact plugs passing through the lower interlayer dielectric layer and contacting the first phase changeable data storage elements; and
a plurality of second contact plugs passing through the middle interlayer dielectric layer and contacting the second phase changeable data storage elements.

7. The memory device of claim 6, wherein the first contact plugs are part of the same material layer.

8. The memory device of claim 6, wherein the first contact plugs comprise at least one of TiN, TiAlN, TiSiN, TaAlN and TaSiN.

9. The memory device of claim 6, wherein the second contact plugs comprise a material having a different resistivity from the first contact plugs.

10. The memory device of claim 1, wherein the lower interlayer dielectric layer comprises a first insulating layer and a first chemical mechanical polishing (CMP) stopper layer on the first insulating layer.

11. The memory device of claim 10, wherein the first CMLP stopper layer comprises a silicon nitride layer.

12. The memory device of claim 1, wherein the middle interlayer dielectric layer comprises a second insulating layer and a second CMP stopper layer on the second insulating layer.

13. The memory device of claim 12, wherein the second CMP stopper layer comprises a silicon nitride layer.

14. The memory device of claim 1, wherein each of the first phase changeable data storage elements comprises a first phase changeable material layer pattern and a first top electrode on the first phase changeable material layer and wherein each of the second phase changeable data storage elements comprises a second phase changeable material layer pattern and a second top electrode on the second phase changeable material layer.

15. The memory device of claim 14, wherein the first and second phase changeable material layer patterns comprise a compound material comprising germanium (Ge), tellurium (Te) and stibium (Sb).

16. The memory device of claim 14, wherein the first and second top electrodes each comprise a titanium nitride (TiN) layer.

17. The memory device of claim 1, further comprising an upper interlayer dielectric layer interposed between the plate electrode and the second phase changeable data storage elements, wherein the plate electrode is electrically connected to the first phase changeable data storage elements through first metal contact holes that penetrate the upper interlayer dielectric layer and the middle interlayer dielectric layer, and wherein the plate electrode is electrically connected to the second phase changeable data storage elements through second metal contact holes that penetrate the upper interlayer dielectric layer.

18. A method of fabricating a phase changeable memory device comprising:
forming a lower interlayer dielectric layer on a semiconductor substrate;
forming a plurality of first phase changeable data storage elements on the lower interlayer dielectric layer;
forming a middle interlayer dielectric layer covering the first phase changeable data storage elements and the lower interlayer dielectric layer;
forming a plurality of second phase changeable data storage elements on the middle interlayer dielectric layer, the first and second phase changeable data storage elements being arrayed in rows and columns such that respective first phase changeable data storage elements are disposed between respective adjacent second phase changeable data storage elements in the rows and columns; and
forming a plate electrode overlying the first and second phase changeable data storage elements and electrically connected to the first and second phase changeable data storage elements.

19. The method of claim 18, wherein the lower interlayer dielectric layer is formed by sequentially stacking a first insulating layer and a first CMP stopper layer.

20. The method of claim 19, wherein the first CMP stopper layer comprises a silicon nitride layer.

21. The method of claim 18, further comprising:
forming a plurality of first contact plugs passing through the lower interlayer dielectric layer prior to forming the first phase changeable data storage elements; and
forming a plurality of second contact plugs passing through the middle interlayer dielectric layer prior to forming the second phase changeable data storage elements, the first contact plugs comprising a first group of first contact plugs in contact with the first phase changeable data storage elements and a second group of first contact plugs under the second phase changeable data storage elements, and the second contact plugs being interposed between the second phase changeable data storage elements and the second group of first contact plugs.

22. The method of claim 21, wherein the first contact plugs comprise at least one of TiN, TiAlN, TiSiN, TaAlN and TaSiN.

23. The method of claim 21, wherein the second contact plugs comprise at least one of TiN, TiAlN, TiSiN, TaAlN and TaSiN.

24. The method of claim 18, wherein the middle interlayer dielectric layer is formed by sequentially stacking a second insulating layer and a second CMP stopper layer.

25. The method of claim 24, wherein the second CMP stopper layer comprise a silicon nitride layer.

26. The method of claim 18, wherein forming the first phase changeable data storage elements comprises:
sequentially forming a first phase changeable material layer and a first conductive layer on the lower interlayer dielectric layer; and
successively patterning the first conductive layer and the first phase changeable material layer to form first phase changeable material layer patterns two dimensionally arrayed on the lower interlayer dielectric layer and first top electrodes stacked on the first phase changeable material layer patterns.

27. The method of claim 26, wherein the first phase changeable material layer comprises a compound layer comprising germanium (Ge), tellurium (Te) and stibium (Sb), and wherein the first conductive layer comprises a titanium nitride (TiN) layer.

28. The method of claim 18, wherein forming the second phase changeable data storage elements comprises:
   sequentially forming a second phase changeable material layer and a second conductive layer on the middle interlayer dielectric layer; and
   successively patterning the second conductive layer and the second phase changeable material layer to form second phase changeable material layer patterns two dimensionally arrayed on the middle interlayer dielectric layer and second top electrodes stacked on the second phase changeable material layer patterns.

29. The method of claim 28, wherein the second phase changeable material layer comprises a compound layer comprising germanium (Ge), tellurium (Te) and stibium (Sb), and wherein the second conductive layer comprises a titanium nitride (TiN) layer.

30. The method of claim 18, further comprising:
   forming a plurality of first contact plugs passing through the lower interlayer dielectric layer prior to forming the first phase changeable data storage elements; and
   forming a plurality of second contact plugs passing through the middle interlayer dielectric layer and the lower interlayer dielectric layer prior to forming the second phase changeable data storage elements, the first contact plugs being in contact with the first phase changeable data storage elements and the second contact plugs being in contact with the second phase changeable data storage elements.

31. The method of claim 30, wherein the first contact plugs comprise at least one of TiN, TiAlN, TiSiN, TaAlN and TaSiN.

32. The method of claim 30, wherein the second contact plugs comprise a material having a different resistivity from the first contact plugs, and wherein the material layer comprises one of TiN, TiAlN, TiSiN, TaAlN and TaSiN.

33. The method of claim 18, wherein forming the plate electrode compnses:
   forming an upper interlayer dielectric layer on the substrate having the second phase changeable data storage elements thereon;
   patterning the upper interlayer dielectric layer and the middle interlayer dielectric layer to form metal contact holes that expose the first and second phase changeable data storage elements; and
   forming a conductive layer pattern on the upper interlayer dielectric layer, the conductive layer pattern being electrically connected to the first and second phase changeable data storage elements through the metal contact holes.

* * * * *

UNITED STATES PATENT AND TRADEMARK OFFICE
CERTIFICATE OF CORRECTION

PATENT NO. : 7,037,762 B2 Page 1 of 1
APPLICATION NO. : 10/430980
DATED : May 2, 2006
INVENTOR(S) : Jae-Hyun Joo et al.

It is certified that error appears in the above-identified patent and that said Letters Patent is hereby corrected as shown below:

Column 11, line 34, change "CMLP" to – CMP –.

Signed and Sealed this

Twenty-second Day of August, 2006

JON W. DUDAS
*Director of the United States Patent and Trademark Office*